United States Patent [19]
Ban et al.

[11] Patent Number: 5,512,417
[45] Date of Patent: Apr. 30, 1996

[54] POSITIVE RESIST COMPOSITION COMPRISING A BIS (T-BUTOXYCARBONYLMETHLY (THYMOLPHTHALEIN AS A DISSOLUTION INHIBITOR

[75] Inventors: Hiroshi Ban, Machida; Akinobu Tanaka, Atsugi; Fujio Yagihasi, Kawasaki; Jun Watanabe, Kawasaki; Minoru Takamizawa, Kawasaki, all of Japan

[73] Assignees: Shin-Etsu Chemical Co., Ltd.; Nippon Telegraph and Telephone Corp., both of Tokyo, Japan

[21] Appl. No.: 388,508

[22] Filed: Feb. 14, 1995

[30] Foreign Application Priority Data

Feb. 14, 1994 [JP] Japan ..................... 6-037541

[51] Int. Cl.$^6$ ..................... G03F 7/004; G03F 7/039
[52] U.S. Cl. ................. 430/270.14; 430/326; 430/905; 430/917; 430/918; 430/942; 430/966
[58] Field of Search ..................... 430/170, 270, 430/909, 907, 942, 966, 905, 326, 917, 918

[56] References Cited

U.S. PATENT DOCUMENTS

| | | | |
|---|---|---|---|
| 4,491,628 | 1/1985 | Ito et al. | 430/270 |
| 4,968,581 | 11/1990 | Wu et al. | 430/192 |
| 5,173,389 | 12/1992 | Uenishi et al. | 430/193 |
| 5,332,648 | 7/1994 | Kihara et al. | 430/270 |
| 5,348,838 | 9/1994 | Ushirogouchi et al. | 430/270 |
| 5,403,695 | 4/1995 | Hayase et al. | 430/270 |

*Primary Examiner*—John S. Y. Chu
*Attorney, Agent, or Firm*—Millen, White, Zelano & Branigan

[57] ABSTRACT

A positive resist composition comprising a poly(p-hydroxystyrene) as matrix resin which is synthesized by an anionic polymerization method and has a weight average molecular weight of from 8,000 to 20,000, bis(p-t-butoxycarbonylmethyl)thymolphthalein as dissolution inhibitor, bis(p-t-butylphenyl)iodonium triflate as acid generator; a compound which contains one amino group and one carboxyl group to function as acid deactivator and propylene glycol monomethyl ether acetate as organic solvent.

8 Claims, 4 Drawing Sheets

POSITIVE RESIST COMPOSITION COMPRISING A BIS (T-BUTOXYCARBONYLMETHLY (THYMOLPHTHALEIN AS A DISSOLUTION INHIBITOR

FIELD OF THE INVENTION

The present invention relates to a positive resist composition of the chemical amplification type which is used in the microlithographic arts.

BACKGROUND OF THE INVENTION

Resists of the chemical amplification type are characterized by their patterning reaction in which the decomposition of acid-decomposable functional groups or the crosslinking of acid-crosslinkable functional groups is promoted by using as a catalyst a strong acid produced by exposure in a thermal treatment carried out after the exposure (the so-called post exposure bake, which is abbreviated as PEB). Such resists can be applied to various types of lithographic arts, e.g., excimer lithography, electron-beam lithography, X-ray lithography and so on. As they are sensitized by the use of the catalytic reaction, the resists of the foregoing type are particularly suitable for electron-beam lithography and X-ray lithography in which high sensitivity is required.

In the lithographic arts, the standard of requirement for sensitivity is 1 $\mu C/cm^2$ with respect to electron-beam resists, while it is 100 $mJ/cm^2$ with respect to X-ray resists. It is a well-known fact that a resist responsive to electron beams has responsiveness to X rays also. Actually, there is a good correlation between the electron-beam sensitivity and the X-ray sensitivity. Although these sensitivity values depend on the characteristics and the condition of light sources used, it can be roughly estimated that the electron-beam sensitivity of 1 $\mu C/cm^2$ corresponds to the X-ray sensitivity of 50–100 $mJ/cm^2$.

As far as attention is paid to the sensitivity alone, it is easy for the resists of chemical amplification type to fulfill the foregoing standard requirement since the sensitivity can be freely controlled by changing the PEB condition. However, resists cannot serve a practical purpose unless requirements for all the characteristics thereof, namely not only sensitivity but also other various characteristics including resolution, dimensional control, heat resistance, dry etching resistance, storage stability and film-thickness control, are cleared up. Further, the application target in electron-beam lithography and X-ray lithography has much finer dimensions than the lower limit thereon in light lithography. Accordingly, the requirement for each characteristic becomes extremely severe. Such being the case, it is the present situation that previously proposed positive resists for electron-beam or X-ray lithography have not succeeded in bearing characteristics excellent enough for practical use.

Moreover, positive resists of the chemical amplification type have the problem that their acid-decomposable protective groups are gasified through the decomposition during the base-plate processing with plasma or the UV curing as the pretreatment of the base-plate processing, and so they tend to cause a decrease in film thickness and form a distorted pattern. For instance, a two-component positive resist of the type which contains poly(p-t-butoxycarbonyloxystyrene) (PBOCST) as a main component in the proportion of, e.g., 90 wt % suffers a weight loss of, e.g., greater than 40 wt % because t-butoxycarbonyl (t-Boc) groups comprise 45% of the PBOCST's weight. As a change in resist density is just a little, on the other hand, the loss in weight gives rise to a decrease in film thickness and the formation of a distorted pattern. This phenomenon is a serious drawback. Not only PBOCST has this drawback, but also other two-component positive resists have it in common, because the amount of protective groups introduced therein is large in general.

Also, three-component resists encounter the above-described problem, For instance, the three-component resists which we developed before had a weight loss of about 9% through the decomposition of the protective groups during the UV curing and a marked distortion with respect to the hole pattern wherein each hole is encircled with the resist. Occasionally, we observed in the foregoing resists a distortion of 0.1 $\mu m$ or greater. Thus, it has turned out that, even if the proportion of gasifiable protective groups to the resist as a whole is reduced to 9 wt %, the resist is not adequate for fine processing on the level of 0.2 $\mu m$.

A definite guideline on the limit of an allowable weight loss in the resist due to decomposition and gasification of the protective groups contained therein has not yet been laid down by anyone skilled in the arts, In electron-beam and X-ray lithographic processes however, it is required that the dimensional accuracy be on a level higher than in conventional photolithography. Therefore, the weight loss in a conventional photoresist of diazonaphthoquinone-novolak type can be adopted as an index to the positive resists for electron-beam or X-ray lithography. More specifically, since the weight loss in the photoresist due to the elimination of nitrogen through the photochemical reaction is at most 3–4%, although it depends on the structure of the diazonaphthoquinone compound used and the content thereof, the weight loss due to the removal of protective groups should be controlled to less than 4% in the positive resists of chemical amplification type, too.

As the weight loss is determined primarily by the amount of protective groups introduced, the foregoing limitation on weight loss can easily be attained so far as the sacrifice of resolution and residual film characteristics is made, and so some known positive resists of chemical amplification type have already succeeded in weight loss control from the theoretical point of view. However, the fact is that such limitation is not yet fulfilled in any compositions which have various resist characteristics excellent enough to serve a practical purpose.

In addition, ensuring heat resistance is an important problem. In the case of a photoresist of the diazonaphthoquinone-novolak resin type, the heat resistance is substantially raised by the development with an alkaline aqueous solution, because the diazonaphthoquinone compound and the novolak resin are linked together by the diazo coupling reaction which takes place during the development. However, conventional positive resists of the chemical amplification type were devoid of such a mechanism. When a novolak resin was used therein as a main component, therefore, the resulting resists tended to cause a thermal flow during the base-plate processing with plasma. Thus, a problem of thermal resistance was posed to the positive resists of the type which contained a novolak resin as a main component. Although an attempt to improve the heat resistance of such resists was made by subjecting them to UV curing, it had a disadvantage in that the curing was difficult to proceed or required a long time.

Under these circumstances, it was pointed out that the resists using poly(hydroxystyrene)s (abbreviated as "PHS" hereinafter) were hopeful because of their high glass transition temperatures. Hitherto, PHS have been regarded as very low in compatibilities with other materials. However, it was recently found that PHS were compatible with compounds of specific structures when they were mixed in the specified range of proportions. Thus, the three-component resists of the type which contain PHS as a main component have been developed. Of the ortho-, the meta- and the para-isomers of PHS, only poly(p-hydroxystyrene) (p-PHS) is on the market, and so there is no room to chose an isomer other than p-PHS as a material of the resist composition from the viewpoints of availability and price. For instance, a three-component positive resist of the chemical amplification type which comprises p-PHS, an onium salt and a dissolution inhibitor is disclosed in Japanese Tokkai Hei 3-344686 (the term "Tokkai" as used herein means an "unexamined published patent application"). However, the resolution of this composition is 0.3 μm at the highest and the sensitivity is not described explicitly. If it is analogized from the results of Examples 32 to 56 wherein other resins are used, the sensitivity will be 5 μC/cm$^2$ at the highest. Moreover, it has been revealed by our examination that the p-PHS using three-component resist compositions were inadequate for serving the practical use unless very severe restrictions were imposed thereon. This was because various unfavorable phenomena occurred depending on the proportions of individual ingredients to the composition as a whole and the kind of solvent used in the composition. For instance, some of the compositions had marked striation when they were applied in a film, some of them gave rise to the formation of quite a number of particles having a size on the order of a micron at the resist surface after the development, some on them caused the generation of craters having a diameter of the order of a submicron at the resist surface after the development, and some of them formed patterns of an inverted-taper shape. Accordingly, it is hard to say that the above-cited invention is adequate to the requirements of practical use.

As described above, there has not yet been known such a perfect chemical-amplification type positive resist for electron-beam or X-ray lithography as to satisfy all practical-use requirements. More specifically, the requirements are to have the sensitivity on the order of 1 μC/cm$^2$ to electron beams or on the order of 100 mJ/cm$^2$ to X rays, to have the resolution on the order of 0.1–0.2 μm, to have the heat resistance on such a level as to withstand the substrate processing with plasma, to control the weight loss due to decomposition of protective groups to less than 4%, to be applicable in a film of uniform thickness, to form patterns of an ideal shape, to ensure desirable residual film characteristics to the resist after the development, and so on.

SUMMARY OF THE INVENTION

Therefore, an object of the present invention is to provide a chemical-amplification type positive resist suitable for electron-beam or X-ray lithography which has high sensitivity, high resolution, heat-resisting properties, dimension controllability and excellent pattern-shape characteristics.

The above-described object of the present invention is attained by a positive resist composition comprising p-PHS, a dissolution inhibitor, an onium salt, a nonionic surfactant, an acid deactivator and an organic solvent; with the p-PHS being a poly(p-hydroxystyrene) synthesized by an anionic polymerization method and having a weight average molecular weight of from 8,000 to 20,000, with the dissolution inhibitor being bis(p-t-butoxycarbonylmethyl)thymolphthalein (BATP) represented by the following structural formula (I), with the onium salt being bis(p-t-butylphenyl)iodonium triflate, with the acid deactivator being a compound containing one amino group and one carboxyl group, and with the organic solvent being propylene glycol monomethyl ether acetate:

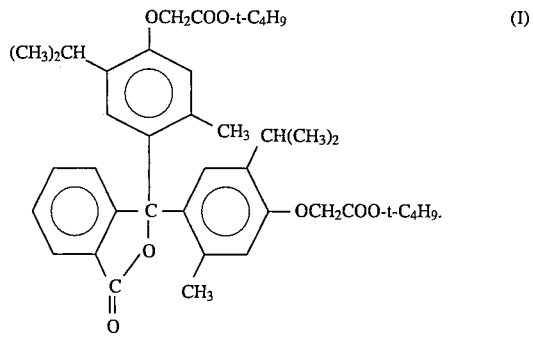

In accordance with embodiments of the present invention, there can be obtained positive resist compositions which can provide high sensitivities in electron-beam and X-ray lithographic processes, namely less than 100 mJ/cm$^2$ in X-ray lithography and about 1 μC/cm$^2$ in electron-beam lithography and the resolution on the level of 0.2 μm or higher, have excellent controllability with respect to film thickness, and enable faithful processing in etching a substrate by plasma etching since they have sufficiently high heat resistance and dimensional controllability of within ±10%. In particular, the positive resist compositions according to the present invention can provide patterns having a profile excellent in verticality.

DETAILED DESCRIPTION OF THE INVENTION

Figure 1:
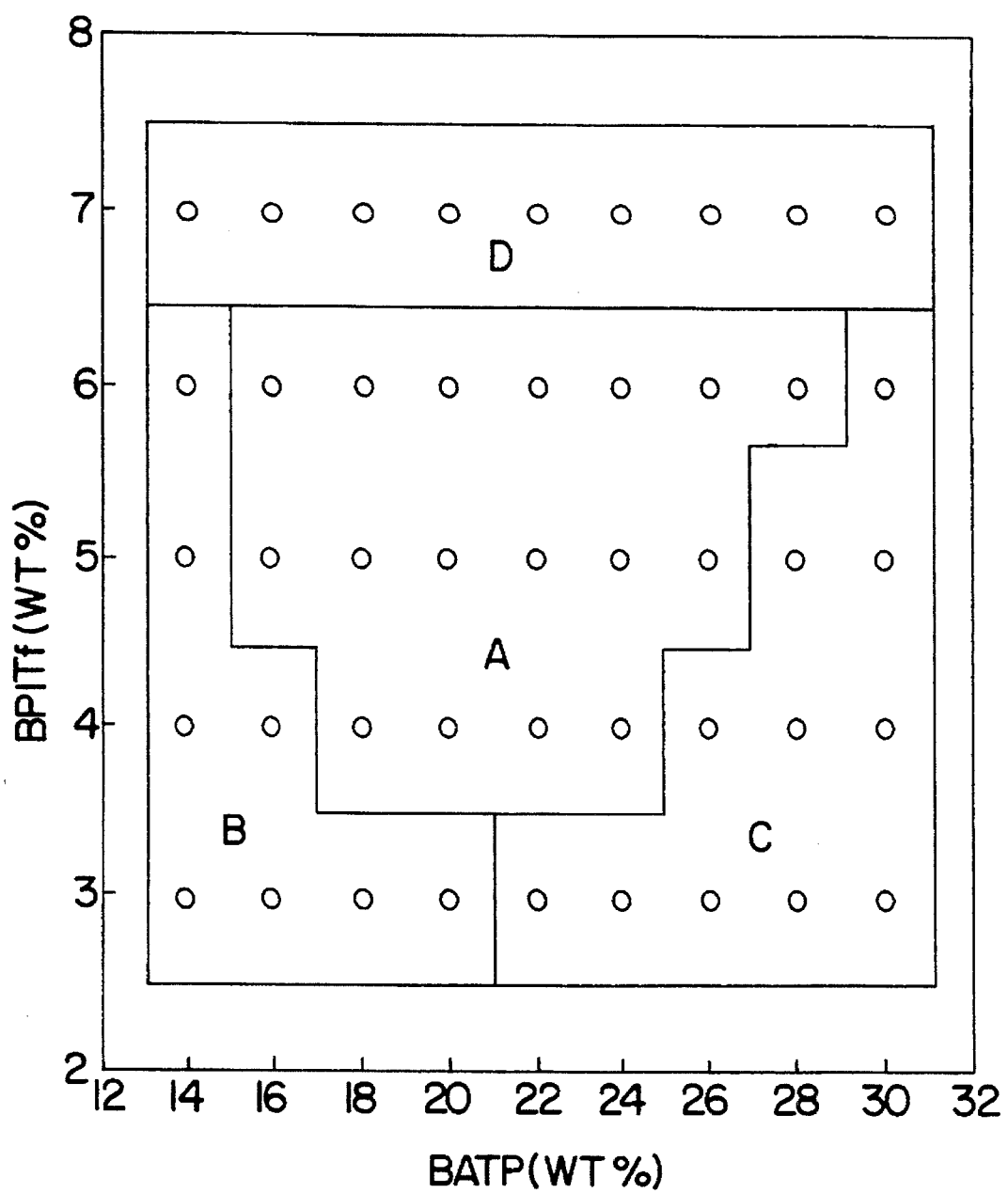
FIG. 1 is a diagram showing the resist characteristics examined adding the dissolution inhibitor and the acid generator in various proportions. Therein, each lattice point represents the composition examined, and A, B, C and D respectively represent domains divided depending on the characteristic features the compositions therein have in common.

To the matrix resin as a main component of the present composition, p-PHS synthesized using a living anionic polymerization method is applied. According to the living anionic polymerization method, the so-called monodisperse polymer having a $M_W/M_N$ ratio of 1.1±0.1 (wherein $M_W$ stands for a weight average molecular weight, $M_N$ stands for a number average molecular weight, and the ratio between them is called a molecular weight distribution) can be obtained without any particular contrivance. As it has a narrow molecular weight distribution, the monodisperse polymer shows a very sharp curve with respect to its solubility in a solvent composition. Therefore, an improvement in resolving power can be produced by using in the resist composition the p-PHS obtained by living anionic polymerization, compared with the case of using the p-PHS obtained by radical polymerization. Even when the living anionic polymerization method is adopted, however, the p-PHS having a molecular weight in the range of 5,000 to 6,000 causes the bridging in a line-and-space (L/S) pattern of below 0.3 μm and generates scum to a conspicuous extent. These phenomena, although they decline with increasing the molecular weight, are observed until the molecular weight comes to about 8,000. Accordingly, it is required of the p-PHS to have a molecular weight greater than 8,000. On the other hand, when the p-PHS having a molecular weight greater than 20,000 is used, the resulting resist film is difficult to control in its thickness and, what is worse, a lowering of resolution is caused therein. Thus, it is desirable that the molecular weight of the p-PHS be in the range of 8,000 to 20,000, preferably 9,000 to 13,000.

As for the dissolution inhibitor, BATP represented by the foregoing formula (I) is used in the present composition. As a result of our intensive studies on three familiar types of phthalein compounds in which phenolphthalein is contained as their fundamental skeleton, namely phenolphthalein, cresolphthalein and thymolphthalein compounds, it was found that the solubilities of t-butoxycarbonyl derivatives of those compounds (the so-called t-Boc-protected compounds) in an organic solvent decreased in the order of phenolphthalein, cresolphthalein and thymolphthalein, and they were insufficient for practical use. On the other hand, the t-butoxycarbonylmethyl derivatives of those compounds proved to be highly soluble in an organic solvent, and their dissolution inhibiting effects upon p-PHS were found to increase in the order of the foregoing description. In addition, the t-butoxycarbonylmethyl derivatives produce carboxylic acid when they undergo an acid-catalyzed reaction, and so they had a dissolution promoting effect in the resist composition. Moreover, since they produce isobutene alone as a by-product, the weight loss therein due to decomposition can be reduced to a low level. Accordingly, the t-butoxycarbonylmethyl derivative of thymolphthalein, or the compound represented by formula (I), proved to be most suitable for the purpose intended.

As for the acid generator, bis(p-t-butylphenyl)iodonium triflate (BPITf) represented by the following formula (II) is applied to the present composition:

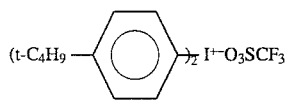

(II)

Of the acid generators of the kind which don't contain any metallic element in a stoichiometric amount and can efficiently proceed with chemical amplification, onium triflates exhibit very excellent characteristics. However, even when a resist composition according to the present invention is prepared substituting BPITf by another onium triflate such as triphenylsulfonium triflate, (p-methoxyphenyl) diphenylsulfonium triflate, (p-methoxyphenyl)phenyliodonium triflate, bis(p-t-butylphenyl)phenylsulfonium triflate or the like, it fails to provide satisfactory residual film characteristics after development. According to our examinations, only BPITf can ensure excellent residual film characteristics and, in other words, excellent shape of patterns, in the resist film after development.

The three constituents, p-PHS, BATP and BPITf, are main ingredients of a resist composition according to the present invention, and comprise at least 99% by weight of nonvolatile components of the present composition. As for the weight proportions of p-PHS, BATP and BPITf, which are herein represented by a, b and c respectively, their preferable ranges are as follows:

$$0.16 \leq b < 0.30$$

$$0.04 \leq c < 0.07$$

$$a+b+c=1$$

When b is less than 0.16, the resulting resist composition is inferior in the residual film characteristics after development, and it is easily ascertained by scattering of vertical incident light that the resulting resist has a rough surface. When b is more than 0.30, many particles are produced on the resist surface at the time of development. When c is less than 0.04, the resulting resist composition has unsatisfactory residual film characteristics; while when c is more than 0.07, the pattern formed has an inverted-taper shape.

Those tendencies vary with the solvent used for application of the composition. For instance, when 2-ethoxyethyl acetate is used as the solvent, the resist surface after development is dotted with craters of submicron order in the vicinity of the pattern. When the solvent is ethyl lactate, the pattern formed has an inverted-taper shape, almost irrespective of the values of b and c. When diglyme is used as the solvent, phase separation tends to occur. In the case of using isoamyl acetate as the solvent, the resulting composition cannot be coated in a uniform film. As a result of examining all the solvents known as the so-called resist solvent to those skilled in the arts, it has been found that propylene glycol monomethyl ether acetate (PGMEA) is the only solvent that is fit for the practical use from the viewpoints of coating characteristics, pattern shape, roughness of the resist surface after development and so on.

Occasionally, it is required to change the ratio between the solid component and PGMEA to some extent according to the intended thickness of resist film. In the case where the composition is coated in a thickness on the order of 0.7–1.2 μm according to a conventional spin coating method, for example, it is desirable that the concentration of the solid component in PGMEA be in the range of 15 to 20% by weight.

Although the desirable composition of the three main ingredients and the solvent is described above, even such a composition causes marked striation in the resist film. The striation becomes a serious problem for the optical alignment, and is responsible for dimensional error. Therefore, the striation is a phenomenon to be avoided in electron-beam and X-ray lithographic processes also.

As a result of intensive studies for solving this striation problem, it has been found that neither cationic nor anionic surfactants, but nonionic surfactants alone enable the prevention of striation without being accompanied by deterioration of patterning properties. For the prevention of striation, a nonionic surfactant is required to have a proportion of at least 0.0065% by weight to the resist solution. When the proportion is increased beyond 0.05% by weight, however, the pattern surface after development is roughened. Therefore, the proportion is required to be below 0.05% by weight. As a result of further examinations of lot consistency of resist production and the margin of application condition, it is preferable for the proportion of the nonionic surfactant to be in the range of 0.01 to 0.03% by weight.

In general, chemical-amplification type resists tend to cause some change in resist characteristics when they are allowed to stand during the period from exposure to PEB. Taking this phenomenon into consideration, therefore, an overcoating method is adopted in evaluating resists according to the present invention, which comprises coating the layer of a resist to be examined with a xylene solution of polymethylstyrene to form an upper layer of the resist, and delaminating the upper layer with xylene after PEB. The overcoating of polymethylstyrene does not directly cause any deterioration and any improvement in resists according to the present invention, but it is used only for avoiding bad influences of acid deactivating impurities in the air. If operations during the period from the exposure until PEB are carried out under reduced pressure or in the atmosphere of an inert gas of high purity, it becomes unnecessary to adopt such a method.

However, an apparatus which enables the operations under the above-described condition is expensive. Thus, the overcoating method which enables a great reduction of production cost is adopted in the present examples.

In accordance with the embodiment as described above, there is prepared a resist which can ensure very high sensitivity in the pattern formation. More specifically, when the prebake after the application of a resist is carried out for 80 seconds at 110° C., and the resulting resist is exposed to electron beams emitted under acceleration voltage of 30 kV or synchrotron soft X-rays having the central wavelength of 0.8 nm, subjected to 120 seconds' PEB at 85° C. and then developed for 40 seconds with a 2.1 wt % aqueous solution of teteramethylammonium hydroxide (TMAH), the sensitivity of 0.8 $\mu C/cm^2$ to the electron beams and the sensitivity of 40 $mJ/cm^2$ to the soft X-rays can be attained.

According to close observation of the shape of the pattern formed, however, the line pattern tends to become gradually more slender toward the middle and the hole pattern tends to stretch out at the opening part or on the surface of a substrate. Although the formation of a vertical pattern is expected in principle since a latent image having a profile perpendicular to the substrate is formed in the pattern formation under exposure to X-rays, the above-described tendency of the pattern shape is observed clearly in fine patterns, particularly in those having a L/S of 0.3 $\mu m$ or less. If the resolution limit is defined as the minimum dimension that can fulfill a dimensional control requirement such that the deviation of a dimension of the pattern formed from the design dimension should be less than ±10%, the attainable resolution limit is nothing but 0.3 $\mu m$ at the highest.

Even when the exposure is carried out under the condition that the PEB temperature is lowered so that the sensitivity may be reduced to 450 $mJ/cm^2$, namely about one order lower than the foregoing sensitivity, the resolution limit cannot attain 0.2 $\mu m$, and there is no prospect for improvement upon the resolution limit by changing the process condition. Therefore, we have made intensive studies on the resolution improvement from the material point of view. As a result thereof, it has been found out that only the addition of a compound containing one amino group and one carboxyl group (the present acid deactivator) in a trace amount to the resist composition can provide a vertical pattern shape and can ensure the resolution limit of 0.2 $\mu m$ in the line pattern and that of 0.15 $\mu m$ in the hole pattern. A main reason why the line pattern can merely have the resolution of 0.2 $\mu m$ at the highest consists in the X-ray optics problem caused by adjusting a gap between the mask and the wafer to 30 $\mu m$. Notwithstanding a dramatic improvement in resolution can be effected, the sensitivity drop is only slight, compared with the resist composition free from the present acid deactivator. The present acid deactivator begins to show its effect upon the improvement of a pattern shape when it is added in an amount of 0.5 micromole per gram of the solid component in the resist compopsition, and it enables the attainment to the permitted limit for the 0.2 $\mu m$ design when it is added in an amount greater than 1.2 micromoles per gram of the solid component in the resist composition. When the amount of the present acid deactivator added is increased beyond 6 micromoles, on the other hand, the resolution is lowered and the pattern in the range of 0.2 $\mu m$ fails in opening. Accordingly, it is desirable that the present acid deactivator be added in an amount of from 1.2 to 6 micromoles/g, preferably from 1.8 to 3.7 micromoles/g. When the present acid deactivator is added in the amount of 2.4 micromoles/g, the sensitivity of 55 $mJ/cm^2$ is obtained. That is, the sensitivity is lowered only by 15 $mJ/cm^2$, compared with the case free from the addition of the present acid deactivator. In particular, anthranilic acid and m- or p-aminobenzoic acid are suitable for the present acid deactivator.

A resist according to the present invention does not give rise to any thermal flow unless the temperature is raised beyond 140° C. Thus, it can be used as the resist for plasma etching of an insulating film base without undergoing any modification. Now that hitherto known, chemically amplified resists of novolak type give rise to a thermal flow at 120° C. or so, the present resist is undoubtedly superior in heat resistance. Moreover, the present invention can embody a resist having excellent properties such that the weight loss in a solid component of the resist, which is caused by the decomposition of protective groups, is nothing but 3.4% at the greatest in the case where the dissolution inhibitor is added in a proportion of 20 wt % and, what is more, contraction of the resist in the plasma etching step and the dimensional change caused thereby are slight enough to suit the generally required dimensional controllability of ±10%.

Now, photosensitive compositions according to the present invention will be illustrated below in more detail by reference to the following examples and comparative examples. However, the invention should not be construed as being limited to these examples.

Additionally, each example was carried out under the following conditions.
1) Method of Preparing Resist Solution:
   p-PHS, BATP and BPITf were weighed in prescribed amounts respectively, and dissolved in PGMEA to prepare a 18 wt % solution. This solution was further admixed with an intended amount of nonionic surfactant or acid deactivator. Prior to coating, the solution was passed through a 0.2 $\mu m$ membrane filter.
2) Method of Forming Film:
   A resist solution was spin-coated on a silicon substrate 6 inch in size by means of a resist coater Mark V, made by Tokyo Electron Limited, and prebaked for 80 seconds at 110° C. On the coat of a resist, a 10% xylene solution of polystyrene (products of Poly Science Inc.) was spin-coated and baked for 60 seconds at 85° C.
3) Exposure to X-rays:
   Synchrotron soft X-rays having the central wavelength of 0.8 nm were used for exposure. As for the mask, a material composed of a 0.65 $\mu m$-thick patterned tantalum absorber and a 2 $\mu m$-thick silicone nitride membrane was used. The gap between the substrate and the mask was adjusted to 30 $\mu m$. The exposure was performed in the air.
4) Exposure to Electron Beams:
   In exposing a resist to electron beams, the drawing apparatus, ABL-2000, made by Apco Limited, was used.

Therein, the acceleration voltage was adjusted to 30 kV or 20 kV.

5) Development:

Within a 1-hour lapse after the exposure, the resist-coated substrate was subjected to 120 seconds' PEB at 85° C. using a hot plate. Thereafter, xylene was sprayed onto the plate for 30 seconds at room temperature as the plate was rotated, and dried by one minute's spinning to delaminate the polystyrene film. Then, the resulting plate underwent 60 seconds' paddle development with a 2.1% TMAH aqueous solution, and further rinsed with purified water for 30 seconds. Thus, a pattern was formed.

COMPARATIVE EXAMPLE 1

In preparing resist solutions, p-PHS synthesized by living anionic polymerization which had a weight average molecular weight of 10,500 and a distribution coefficient of 1.1 was used, BATP was added in nine different proportions changed from 14 wt % to 30 wt % at intervals of 2 wt %, BPITf was added in five different proportions changed from 3 wt % to 7 wt % at intervals of 1 wt %, and these ingredients p-PHS, BATP and BPITf were dissolved in PGMEA. Each of the thus prepared resist solutions was coated in a film having a thickness of 0.8–1.1 μm, and subjected to X-ray exposure for evaluation of resist quality. The surface roughness after the development, the decrease in film thickness, the presence of particles and the X-ray sensitivity were examined, and the results thereof are shown in FIG. 1. More specifically, FIG. 1 is a diagram illustrating the resist characteristics examined changing variously the proportions of BATP (dissolution inhibitor) and BPITf (acid generator). Therein, each lattice point corresponds to each composition examined, and A, B, C and D represent domains which each can be distinguished from the others with respect to resist characteristics. Additionally, the numbers on the abscissa indicate the proportions of BATP (wt %) and those on the ordinate the proportions of BPITf (wt %).

In the domain B, a light scattering phenomenon was observed to a considerable extent when the incident light was perpendicular to the resist surface, because the resist surface was roughened after the development. In addition, the decrease in film thickness was greater than 0.1 μm in that domain.

In the domain C, quite a number of particles were generated on the resist surface after development.

In the domain D, the resist pattern had a shape of inverted taper.

In the domain A, the phenomena as described above, namely the surface roughening, the decrease in film thickness and the generation of particles, were not observed at all or, if those phenomena occurred, the extents thereof were negligibly small. Therein, the sensitivity of 40±4 mJ/cm² was achieved.

COMPARATIVE EXAMPLE 2

Figure 2:
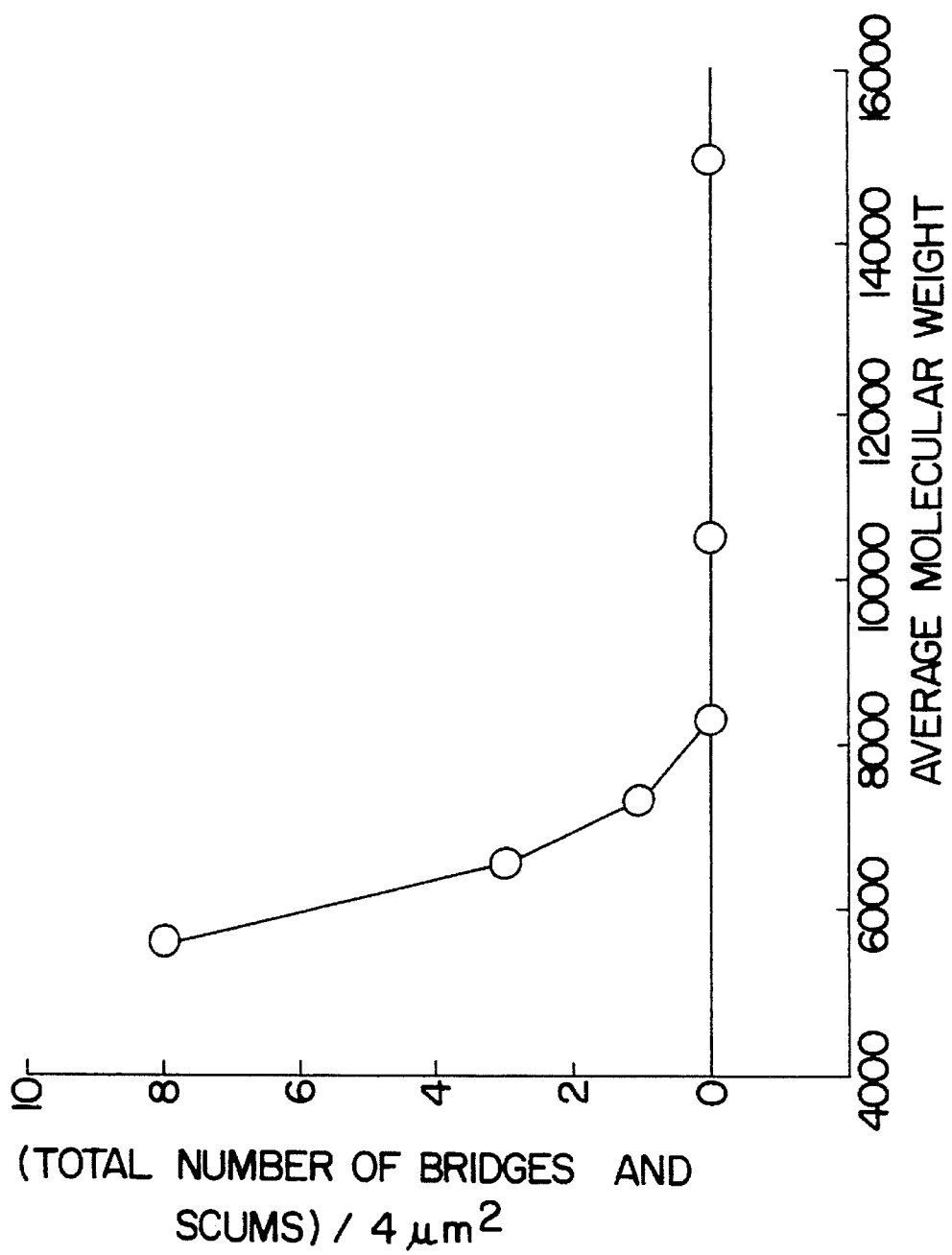
FIG. 2 is a graph showing the relationship between the weight average molecular weight and the total number of bridges and scums generated within the area of 2 microns square in the line-and-space (L/S) range of 0.2 μm.

Six kinds of resist solutions were prepared using six kinds of p-PHS different in weight average molecular weight, namely those having average molecular weights of 5,500, 6,500, 7,300, 8,200, 10,500 and 15,000 respectively, and adjusting the proportion of BATP to 20 wt % and that of BPITf to 5 wt %. These resist solutions each were coated in a film having a thickness of 0.6–1.4 μm. The pattern formation was carried out by X-ray exposure, and there was examined the total number of bridges between adjacent patterns and whisker-like scums generated within the area of 2 microns square in the L/S pattern range of 0.2 μm. The examination result is shown in FIG. 2. More specifically, FIG. 2 is a graph showing the relationship between the weight average molecular weight of p-PHS and the total number of bridges between adjacent patterns and scums generated within the area of 2 microns square in the L/S range of 0.2 μm. In FIG. 2, the weight average molecular weight is plotted as abscissa and the total number of bridges and scums per 4 μm² as ordinate. When the p-PHS had an average molecular weight in the range of 5,500 to 7,300, at least one bridge or scum was observed, but neither bridge nor scum was observed when the average molecular weight was no lower than 8,200.

COMPARATIVE EXAMPLE 3

Figure 3:
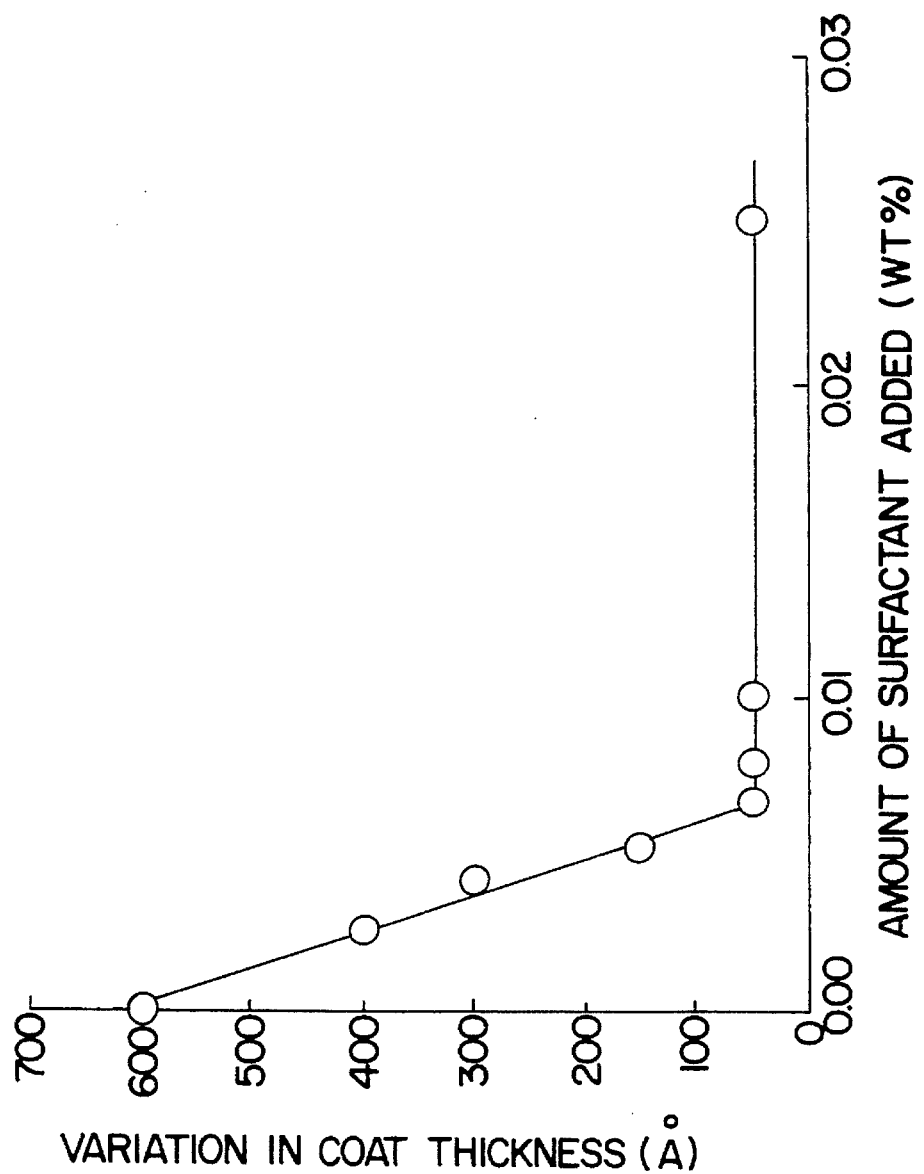
FIG. 3 is a graph showing the relationship between the the amount of a surfactant added and the variation in coat thickness due to striation.

A resist solution was prepared using p-PHS having a weight average molecular weight of 10,500 and adding BATP in the proportion of 20 wt % and BPITf in the proportion of 5 wt %. Thereto was added a nonionic surfactant, FC430 (products of 3M Co., Ltd.), in different amounts to prepare samples. Each sample was spin-coated at 2,300 r.p.m. on a 6-inch silicon base, and examined for striation generated at the surface of the resulting coat by means of a stylus step height meter. Therein, the scanning distance was set at 2 mm and the change of the coat thickness which generated cyclically with tens μm period was measured. The striation was evaluated by the maximum variation in the coat thickness. As shown in FIG. 3, the variation in thickness of a coat decreased with an increase in the amount of FC430 added, and the addition of FC430 in a proportion of no less than 0.0065 wt % to the resist solution enabled a variation of below 50 Å with respect to the coat thickness. Even when the proportion of FC430 was raised up to 0.05 wt %, it had no influence on the thickness variation of the coat. Taking account of influences upon sensitivity, dimensional controllability and other characteristics, however, the optimum amount of FC430 added was found to be 0.01 wt %. With respect to verticality of the pattern shape, on the other hand, the addition of FC430 alone was not able to produce a sufficient effect thereon.

Additionally, FIG. 3 is a graph showing the relationship between the amount of a surfactant added and the variation in coat thickness due to striation. Therein, the numbers on the abscissa indicate the proportion of the surfactant added (wt %), and those on the ordinate the variation in coat thickness (Å).

EXAMPLE 1

Figure 4:
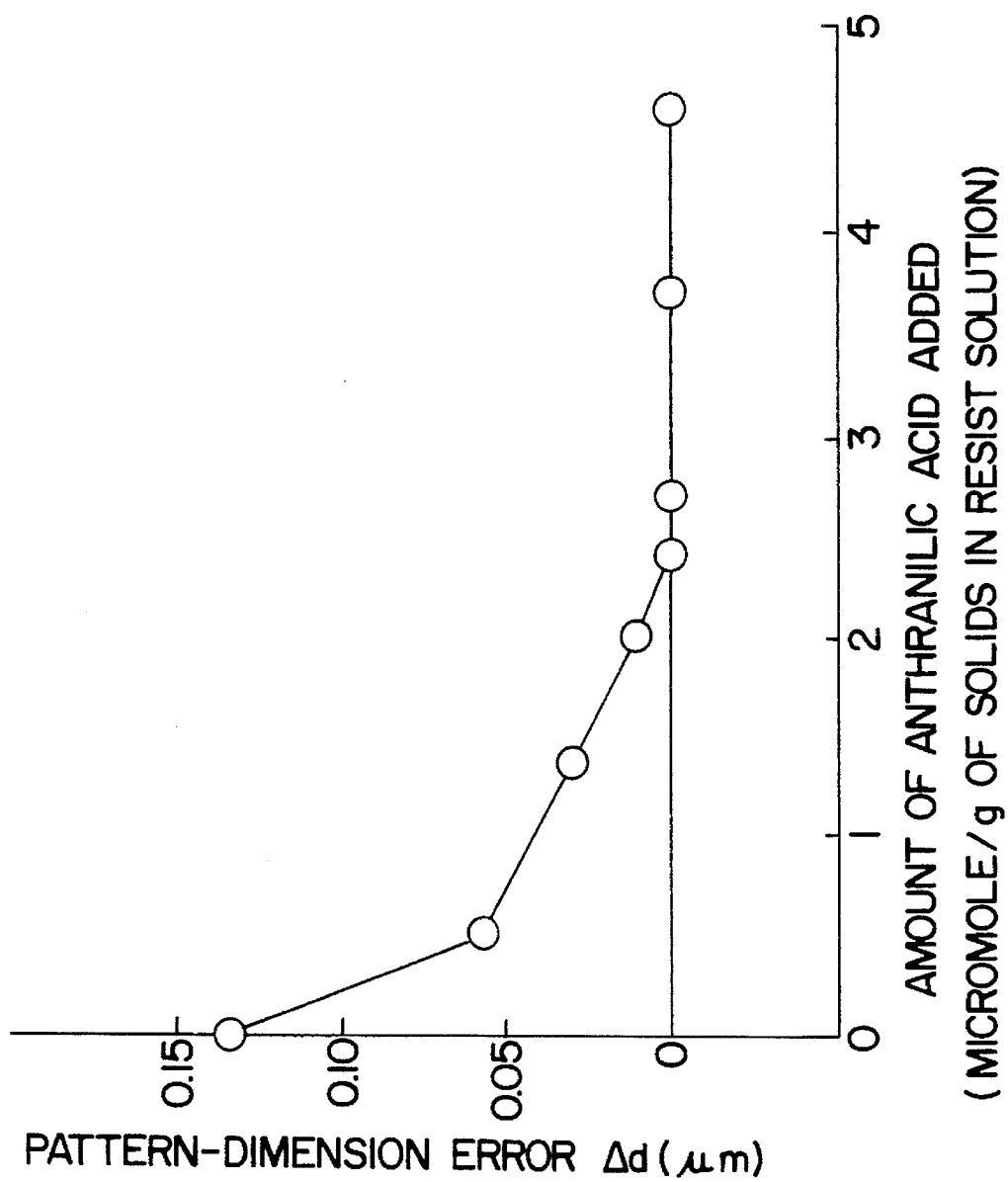
FIG. 4 is a graph showing the relationship between the amount of anthranilic acid added and the pattern-dimension error (Δd) defined as the difference in a hole pattern having a diameter of 0.2 μm between the dimension of the hole at the surface of the substrate and the dimension of the hole at the opening part.

A resist solution was prepared using p-PHS having a weight average molecular weight of 10,500 and adding BATP in the proportion of 20 wt % and BPITf in the proportion of 5 wt %. Thereto was added the foregoing nonionic surfactant in the proportion of 0.01 wt %. To the resulting resist solution was further added anthranilic acid as an acid deactivator in different amounts to prepare samples. Each sample was spin-coated in a layer having a thickness of 1.0 μm, and then patterned by X-ray exposure. The verticality of the pattern shape was evaluated by the difference in a hole pattern having a diameter of 0.2 μm between the dimension of the hole at the surface of the substrate and the dimension of the hole at the opening part (Δd). The results obtained are shown in FIG. 4. More specifically, FIG. 4 is a graph showing the relationship between the amount of anthranilic acid added (plotted as abscissa; unit: micromole/g of solids in the resist solution) and the pattern-dimension error (Δd) defined as the difference in a hole pattern having a diameter of 0.2 μm between the dimension of the hole at the surface of the substrate and the dimension of the hole at the opening part (plotted as ordinate; unit: μm).

As can be seen from FIG. 4, Δd was 0.13 μm, that is, the hole pattern had an inverted-taper shape when the resist solution was free from anthranilic acid, and Δd was decreased with an increase in the amount of anthranilic acid added, until it was gone. That is, the pattern came to have a vertical shape when the amount of anthranilic acid added was increased to 2.4 micromoles per g of solids in the resist solution. Even when the amount was raised up to 1.2 micromoles per g of solids in the resist solution, it was able to attain Δd of no greater than 0.03 μm. This means that the resolution requirement for the fine patterning on the level of 0.2 μm or higher was fully satisfied. Although it was possible to obtain a vertical pattern without attended by any adverse effects on other characteristics so far as the amount of anthranilic acid added was below 6 micromoles, the optimum amount of anthranilic acid added was 2.4 micromoles.

EXAMPLE 2

The resist composition which was prepared in the same manner as in Example 1, but wherein the amount of anthranilic acid added was adjusted to 2.4 micromoles/g, was examined for X-ray sensitivity and electron-beam sensitivity. As a result of its the X-ray sensitivity was found to be 62 mJ/cm$^2$, and the electron-beam sensitivity 1.4 μC/cm$^2$ at 30 kV and 0.9 μC/cm$^2$ at 20 kV.

EXAMPLE 3

Resist compositions were prepared in the same manner as in Example 1, except that anthranilic acid was replaced by equimolar amounts of m- or p-aminobenzoic acid. It was confirmed by the same examinations as described above that m- and p-aminobenzoic acids had the same effect on the resist characteristics as anthranilic acid.

What is claimed is:

1. A positive resist composition comprising: 63 to 80 parts by weight of a poly(p-hydroxystyrene), 16 to less than 30 parts by weight of a dissolution inhibitor, 4 to less than 7 parts by weight of an onium salt, 0.0065 to less than 0.05% by weight in the resist composition of a nonionic surfactant, 1.2 to less than 6 micromoles per gram of the mixture of poly(p-hydroxystyrene), dissolution inhibitor and onium salt of an acid deactivator and an organic solvent; said poly(p-hydroxystyrene) being a poly(p-hydroxystyrene) synthesized by an anionic polymerization method and having a weight average molecular weight of from 8,000 to 20,000, said dissolution inhibitor being bis(p-t-butoxycarbonylmethyl)thymolphthalein represented by the following structural formula (I), said onium salt being bis(p-t-butylphenyl) iodonium triflate, said acid deactivator being a compound containing one amino group and one carboxyl group, and said organic solvent being propylene glycol monomethyl ether acetate:

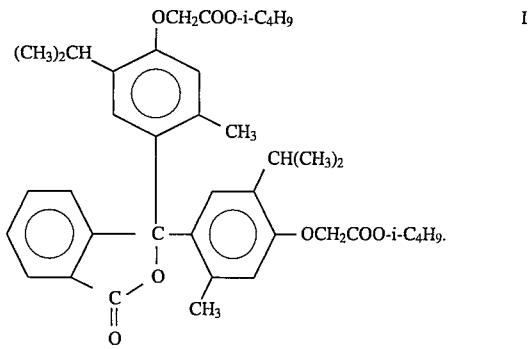

2. A positive resist composition according to claim 1, wherein the poly(p-hydroxystyrene) is a monodisperse polymer having a $M_W/M_N$ ratio of 1.1±0.1 (wherein $M_W$ stands for a weight average molecular weight and $M_N$ stands for a number average molecular weight).

3. A positive resist composition according to claim 1, wherein the acid deactivator is anthranilic acid, m-aminobenzoic acid or p-aminobenzoic acid.

4. A positive resist composition according to claim 1, wherein the mixture of the poly(p-hydroxystyrene), dissolution inhibitor and the onium salt is contained in a proportion of from 15 to 20% by weight to propylene glycol monomethyl ether acetate as the organic solvent.

5. A positive resist composition according to claim 1, wherein the weight average molecular weight of the poly(p-hydroxystyrene) is from 9,000 to 13,000.

6. A positive resist composition according to claim 1, wherein the proportion of the nonionic surfactant is from 0.01 to 0.03 wt % in the resist composition.

7. A positive resist composition according to claim 1, wherein the proportion of the nonionic surfactant is of from 1.8 to 3.7 micromoles per gram of the mixture of the poly(p-hydroxystyrene), the dissolution inhibitor and the onium salt.

8. A positive resist composition according to claim 1, wherein the weight average molecular weight of the poly(p-hydroxystyrene) is from 9,000 to 20,000.

* * * * *